United States Patent [19]
Karpinski

[11] Patent Number: 5,526,373
[45] Date of Patent: Jun. 11, 1996

[54] LENS SUPPORT STRUCTURE FOR LASER DIODE ARRAYS

[76] Inventor: Arthur A. Karpinski, Barker Rd., Jordan, N.Y. 13080

[21] Appl. No.: 252,891

[22] Filed: Jun. 2, 1994

[51] Int. Cl.$^6$ .................................................. H01S 3/08
[52] U.S. Cl. ........................ 372/101; 372/107; 372/108; 372/75
[58] Field of Search .................................. 372/107, 108, 372/101, 98, 75; 359/664, 820

[56] References Cited

U.S. PATENT DOCUMENTS

| | | | |
|---|---|---|---|
| 4,731,795 | 3/1988 | Clark et al. | 372/107 |
| 4,762,395 | 6/1988 | Gordon et al. | 359/820 |
| 5,247,392 | 9/1993 | Piles | 359/664 |
| 5,323,268 | 6/1994 | Kikuchi | 359/664 |

Primary Examiner—Leon Scott, Jr.
Attorney, Agent, or Firm—Sughrue, Mion, Zinn, Macpeak & Seas

[57] ABSTRACT

A lens support structure for supporting one or a plurality of optical elements, the structure including a base which may be a passive or an active optical element having one or more grooves formed therein. The structure is intended for use with a laser diode array, for collimating the emission of the laser diode bars in the array. To this end, the grooves in the base are formed precisely, to match the pitch of the grooves in the laser diode array, so that when the array and the lens support structure are matched, the light from the bars in the array reaches the optical elements disposed in the grooves in the lens support structure. The grooves may be formed along one axis, or along orthogonal axes. The optical elements in the grooves may be microlenses. Also, the base may have the grooves formed as slots extending completely through the base, support rails being formed unitarily with the base orthogonally to the slots.

37 Claims, 7 Drawing Sheets

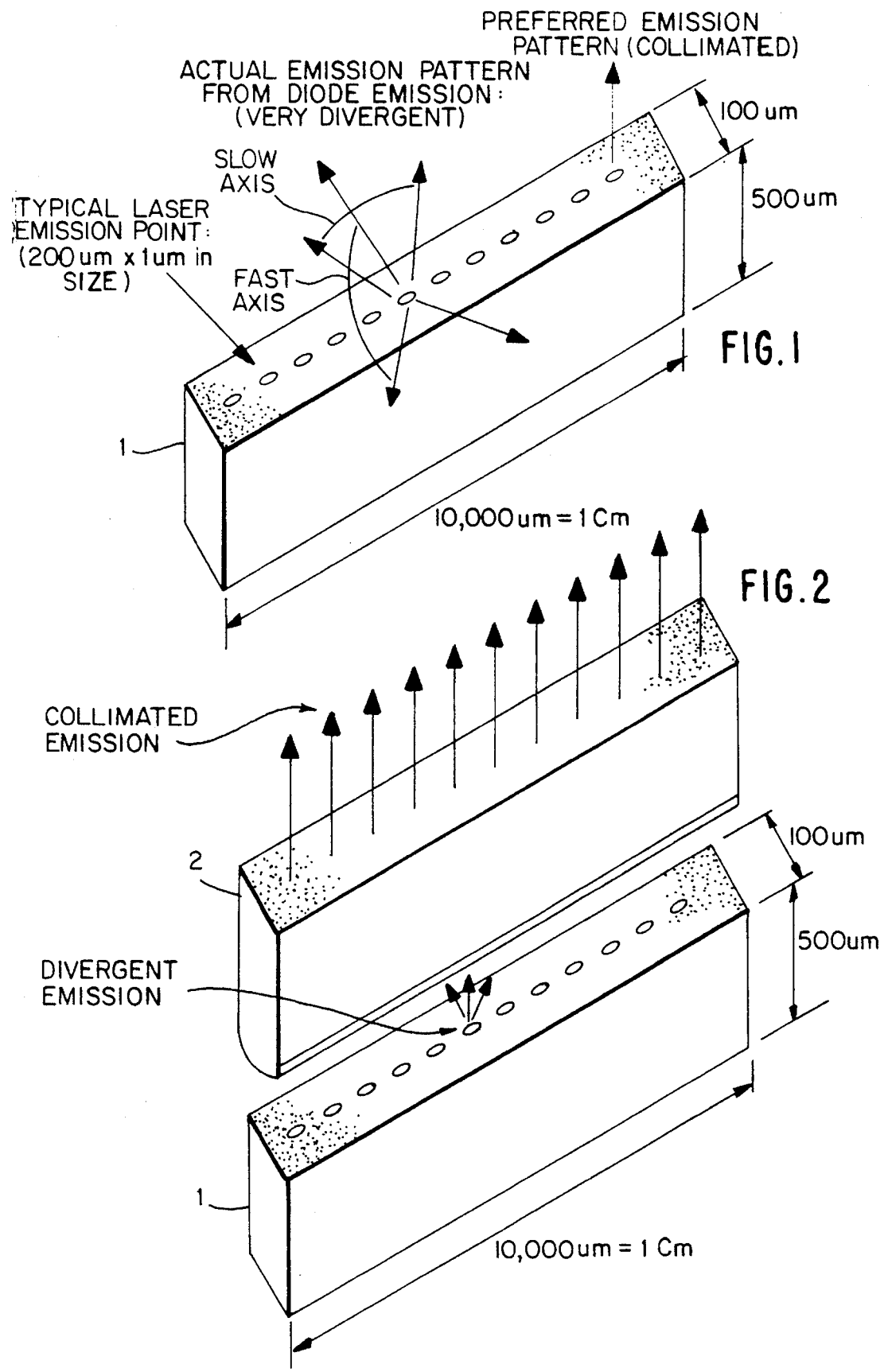

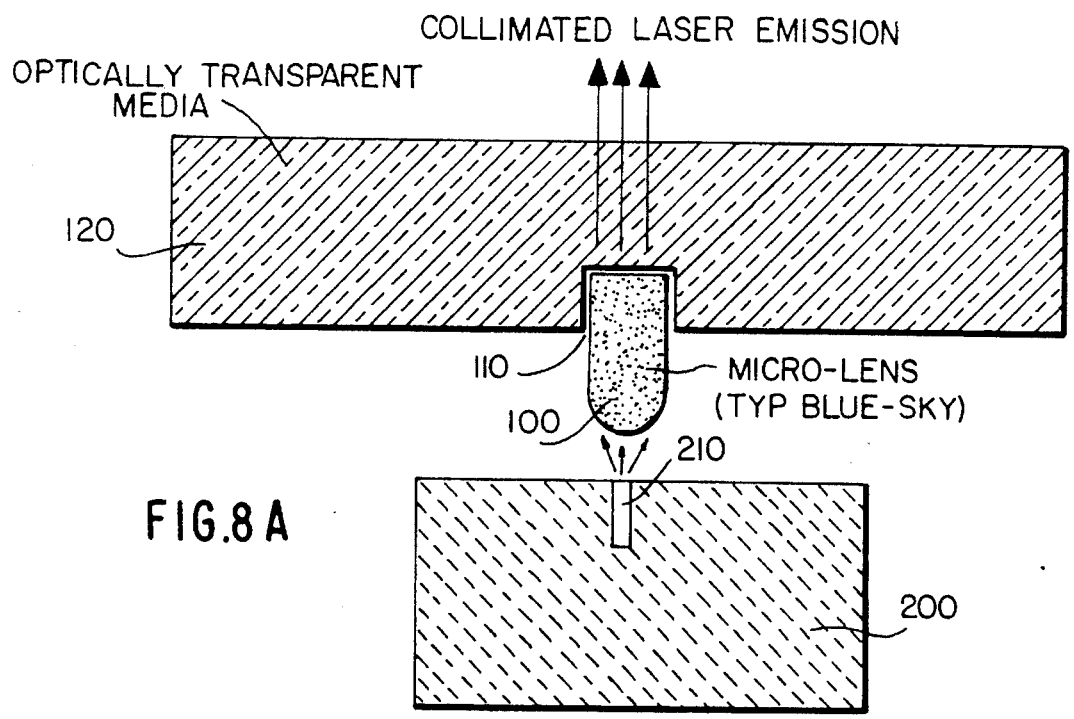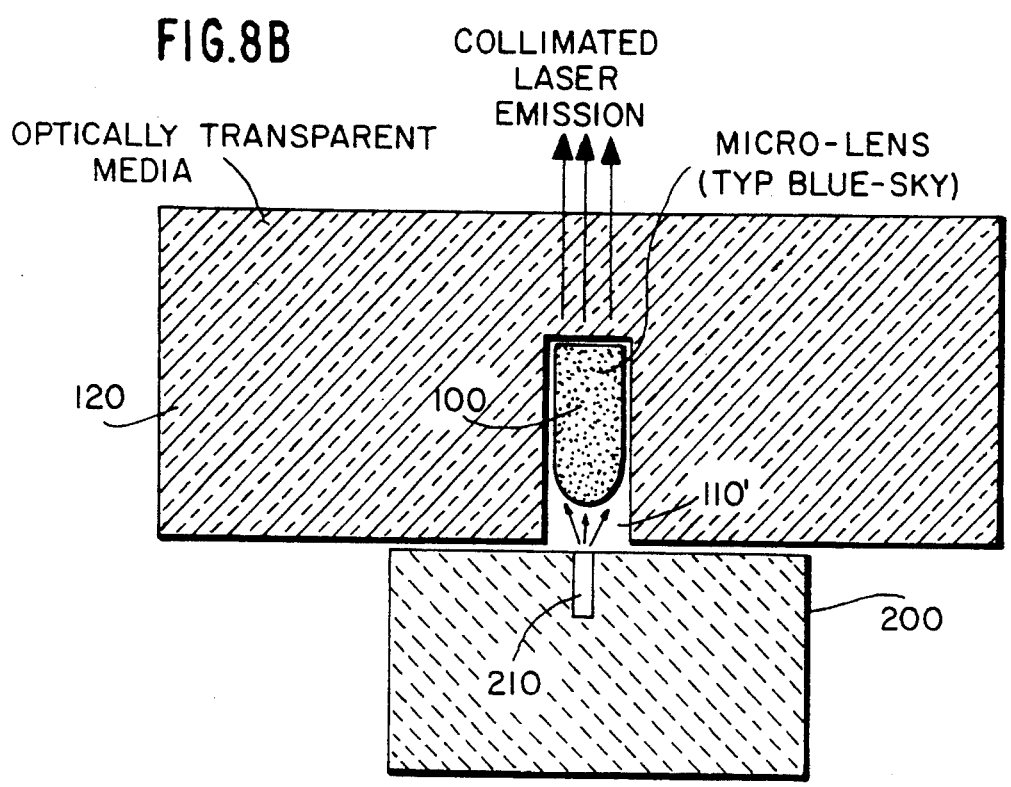

LENS SUPPORT STRUCTURE FOR LASER DIODE ARRAYS

BACKGROUND OF THE INVENTION

The present invention relates to a one or two dimensional lens support structure for use with laser diode arrays. More particularly, the invention relates to a structure for mounting one or a plurality of lenses on a substrate as a subassembly of working lenses, and to a method of fabrication of such a subassembly. The invention has application in many areas requiring collimation of high power semiconductor lasers, including satellite communication directed energy applications, range finding, isotopic separation, pumping of solid state laser systems, and fiberoptic coupling.

Laser diodes are semiconductor structures capable of converting electrical power into optical power with very high efficiency (typically 50%). The present inventor has received patents which disclose and claim laser diode arrays, including U.S. Pat. No. 5,040,187, 5,128,951, 5,264,790 and 5,311,535. The disclosures of these patents are incorporated herein by reference.

In recent years, there have been substantial improvements in the quality and availability of GaAs base laser diode material. In addition, it has become possible for a laser device producer to customize the output wavelength of the emission of laser diodes. The ability to grow laser material for emission at wavelengths of 630 nm to 2 microns make laser diodes a preferred device for fabrication of narrow wavelength emission devices. Many of these devices are of relatively low power, such as those used in laser printers and CD devices, which have power levels on the order of a few milliwatts. However, when individual devices are grouped together, with proper heatsinking, tremendous peak and average power levels can be generated. It is not unusual for several thousand emitters to be packaged into just one square centimeter (1 cm$^2$), the package having an optical emission of several thousand watts of peak power and average powers of from 1 to 100 watts per square centimeter. (Powers are expected to climb even higher in the near future.) These higher power laser diode arrays can be used in simple high power flashlamps for night vision systems, or in very high speed, high intensity flashlamps used in very high speed photography.

Two of the major applications for large very high powered laser diode arrays are for pumping of solid state lasers, such as YAG laser systems and fiberoptic bundles. The outputs from the diode pumped solid state lasers are used in many diverse applications, from so-called target designators, to simple cutting operations, to various types of laser based surgery. Direct diode pumping of fiberoptic bundles typically is used for medical devices, and/or where space requirements do not allow for locating actual laser diode arrays at the point at which the emissions are needed. That is, there may be space for a fiberoptic bundle, but not for the diode array module and associated support equipment.

Diode lasers themselves present problems, with respect to emission area and emission characteristics. During the growth and fabrication of the laser diode device itself, the actual device emission area is extremely small (on the order of 200 microns×1 micron). (By comparison, the typical human hair has a diameter of 100 microns.) Light emitted from such a source does not come out of the device in a narrow "beam", such as that normally seen in laser photos and demonstrations, but instead fans out very quickly. Typically, the divergence of this light can be from 60°–90° (typically 60°) in one axis, (known in the industry as the fast axis because of its relatively fast divergence), and 10°–30° (typically 10°) in the other axis, (known in the industry as the slow axis because of its relatively slow divergence). Examples of the divergence of the light in the different axes is shown in FIG. 1, relative to a typical laser diode bar 1.

While the emission's light intensity and tight wavelength still make laser diodes useful, if the light could be collimated, that is, made to travel in a column or a straight line, laser diodes would become still more useful.

Single laser diode devices, which typically are used in laser printers, CDs and fiberoptics, now provide collimated emissions by using various lens arrangements in front of the laser diode. This technology is well developed and described throughout various technical journals. With ever increasing interest in very high power laser diode arrays, capable of producing multi-kilowatt peak powers, much work has been done trying to mate optics with laser diode arrays in order to provide collimated emissions. While the best answer would be to mold a lens, with the proper dimensions and curvatures, to collimate the emission, it has been difficult to produce such an optical device. While it is possible that a molded lens will be made successfully in the future, for the present individual optics appear to provide the most ready answer to collimation of emissions of laser diode arrays.

Collimation of laser diode emissions via the use of optical elements requires a very high level of mechanical precision. Not only do the optical elements need to be made to the correct dimensions, but also each individual lens element then needs to be located precisely with respect to each other, and more importantly to the emission area for the laser device itself. An example of the necessary accurate positioning is seen in FIG. 2, in which a laser diode bar 1 is shown with a collimating lens 2.

What is necessary to implement the FIG. 2 positioning is an appropriate lens support structure.

SUMMARY OF THE INVENTION

In view of the foregoing, it is one object of the present invention to provide a precision and low cost approach to produce an optical support structure capable of meeting the mechanical precision requirements of the optical elements with respect to each other and to the array whose output is being collimated.

The inventive structure is inexpensive, easily produced, and easily modified to meet the varied requirements of the end user.

To achieve the foregoing and other objects, the inventive lens support structure provides the necessary mechanical precision, support, and modifiability. While the basic concept is the same throughout the description to follow, there are several preferred embodiments and methods of fabrication. The first, simplest embodiment involves the forming of grooves in a base substrate material. Each groove is formed so as to allow precise location and support of an associated lens, thus allowing collimation of the light emission in either the fast axis or the slow axis or both, depending on the lens positioning. The lens are held in place and supported by either simple interference or a mechanical bond.

In a second embodiment, the lens support structure itself is a part of the optical system. For example, the grooves can be formed directly in an active optical element, such as a lens or other transparent element having a curved surface. Alternatively, the grooves can be formed in a passive optical element, such as a microscope slide. Smaller optical elements then could be located with great precision, thus making it possible to form very complex lens elements comprised of relatively simple and less expensive optical elements.

The grooves may be formed so as to extend partially through the base substrate material, or alternatively may extend all the way through the material. In the latter case, the lenses may be supported on support rails formed as part of the base substrate at opposite ends of the support structure.

BRIEF DESCRIPTION OF THE DRAWINGS

The foregoing and other objects and features of the invention will be understood from the following detailed description taken in conjunction with the accompanying drawings, in which:

FIG. 1 is a drawing of a typical industry standard laser diode emitter, showing the divergence of the light from the device in both the fast and slow axes;

FIG. 2 is a drawing of a typical industry standard laser diode emitter, showing a typical lens located for efficient collimation of the emission of the device;

FIGS. 8A–8E show several different shapes of microlenses, inserted into grooves of varying depths, in relation to a laser bar mount containing one or more laser diode bars in confronting relation thereto;

DETAILED DESCRIPTION OF THE PREFERRED EMBODIMENTS

Figure 3:
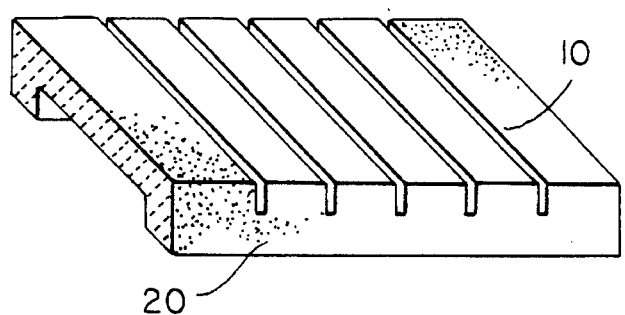
FIG. 3 is a drawing of a lens support structure for collimation of a single axis of the laser device emission, in accordance with one embodiment of the invention.
Figure 4:
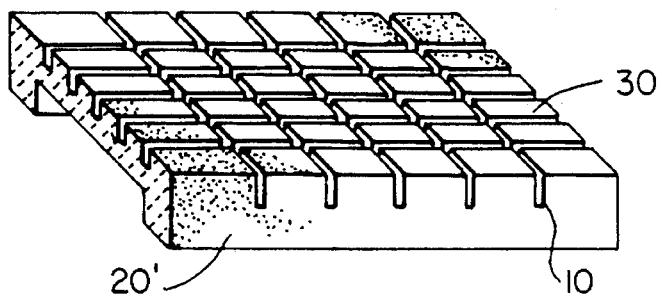
FIG. 4 is a drawing of a lens support structure for collimation of both axes of the laser device emission, in accordance with another embodiment of the invention.

Referring to FIG. 3, grooves 10 are formed in a base material 20, which may be of the same material as that in which a laser diode array is formed, i.e. beryllium oxide, ceramic, or industrial diamond (see the above-referenced U.S. patents). The grooves are formed to have a length, width, and depth to support and locate an optical element (such as a lens or a microlens) precisely with respect to associated laser diode emitters (not shown in this Figure). FIG. 3 shows the grooves being formed in one axis; FIG. 4 shows base material 20' with grooves 10, 30, the grooves 30 being formed orthogonally to the grooves 10 to provide a two-dimensional lens support structure. The two-dimensional structure enables collimation of light emitted by laser diode bars in both the fast and the slow axes.

Figure 5:
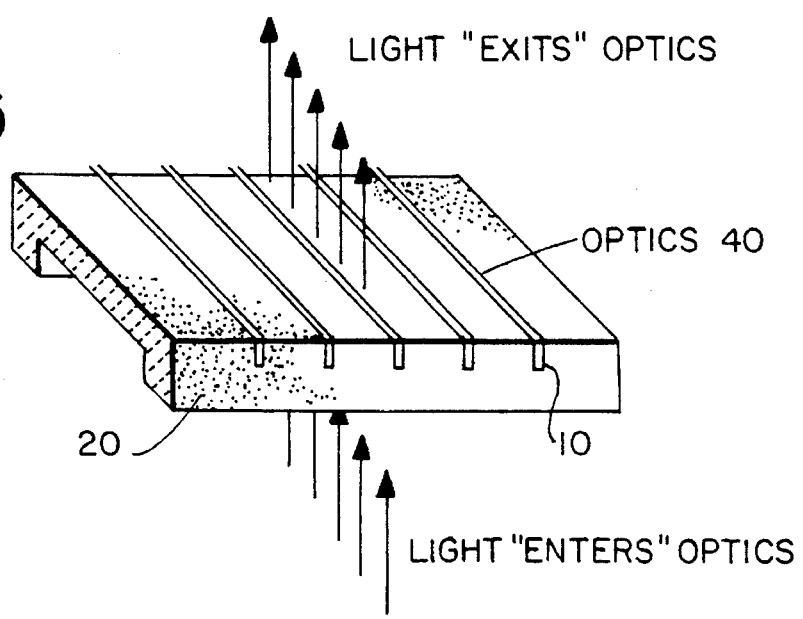
FIG. 5 is a drawing of the lens support structure of FIG. 3, with lenses installed, and a typical optical path through the device for single axis collimation.

FIG. 5 shows the base material 20 with its grooves 10 filled with optical elements 40, such as lenses or microlenses, which collimate the emission from laser diode emitters (not shown), the laser diode emitters being formed in a respective substrate (also not shown). The grooves 10 in base material 20 must be formed at precisely the same pitch as the grooves containing the laser diode emitters, in order to ensure proper collimation of the laser diode emission. Forming the grooves and then locating the optical elements in the grooves assures the precision necessary. As shown in FIG. 5, the laser light from the laser diode array enters the optics from a bottom surface of the base material 20, and exits through the upper surface.

Figure 6:
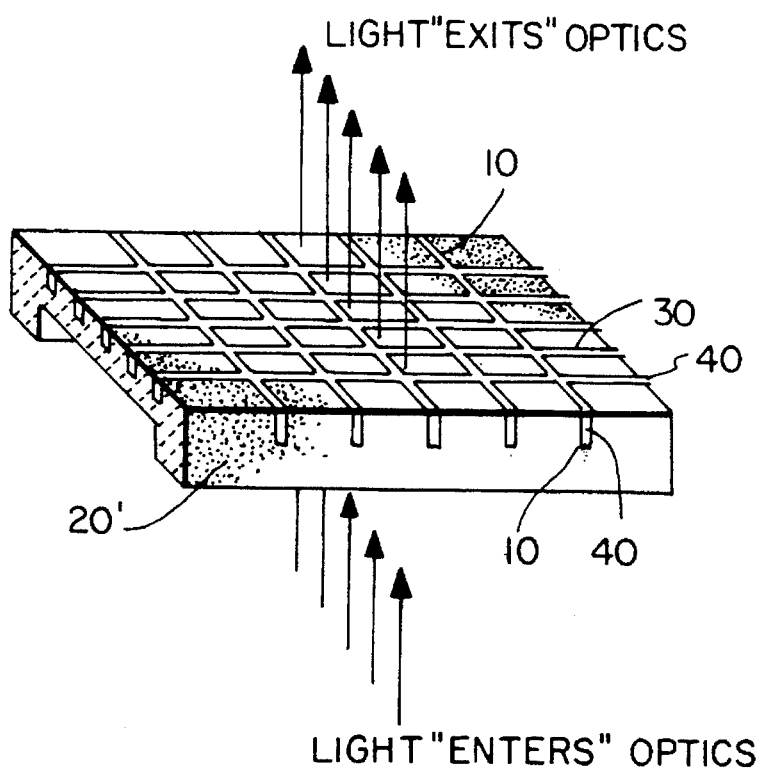
FIG. 6 is a drawing of the lens support structure of FIG. 4, with lenses installed, and a typical optical path through the device for dual axis collimation.

As was the case with FIGS. 3 and 4, while FIG. 5 shows the grooves 10 being formed in one axis in base material 20, FIG. 6 shows grooves 10, 30, formed orthogonally with respect to each other, and optical elements 40 disposed in those grooves to provide a two-dimensional lens support structure.

Figure 7:
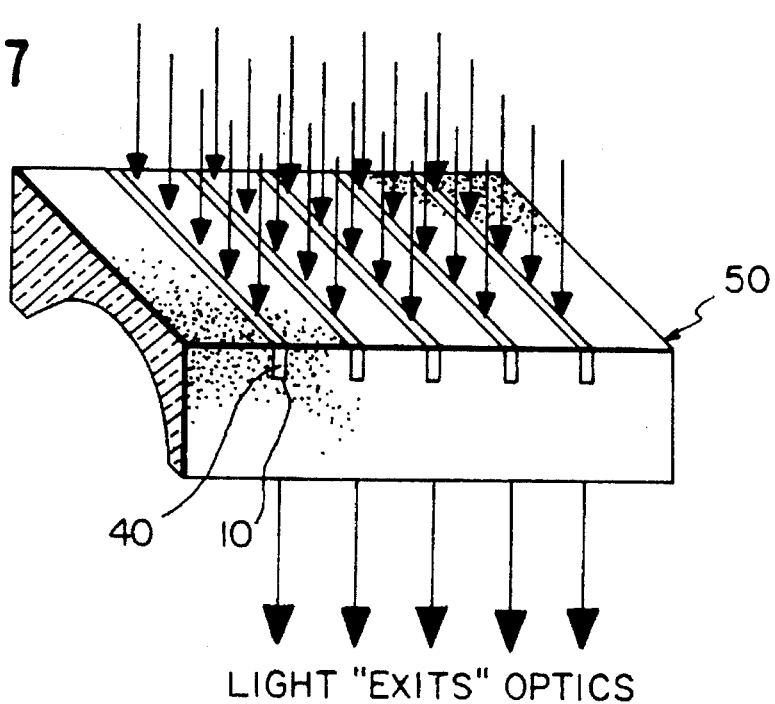
FIG. 7 is a drawing of a lens in lens support structure constituted by an optical element, in accordance with yet another embodiment of the invention.

Referring now to FIG. 7, since the collimation of the laser diode emission can in some circumstances be followed by additional optical elements, it is possible to simplify the structure so as to allow the required collimating optical elements to be located in an active or passive optical element in the required optical train. Thus, as shown in FIG. 7, in accordance with another embodiment of the invention, grooves are formed in an active or passive optical element 50. One example of an active optical element (which would exert some optical effect on the light being passed through it) would be a lens having at least one curved surface, as shown in the Figure. An example of a passive optical element (which would simply allow light to pass through it without alteration, beyond for example the effect caused by the index of refraction of the element) would be a microscope slide, The grooves are formed in the active or passive optical element so as to allow further optical elements to be mounted precisely in the grooves. The optical elements are held in place by interference or by standard optical bonding/mounting methodologies.

FIG. 8A shows one example of a lens 100 mounted in a groove 110 in an optically transparent base 120. As described earlier, the groove 110 is formed precisely in the base 120, so that when the lens 100 is mounted therein, it confronts a laser bar mount 200 precisely, the mount 200 containing one or more laser diode bars 210 inserted therein. Light emitted from the laser diode bars 210 is collimated by the lens 100, and exits through a surface of the base 120 opposite to that in which the groove 110 is formed. Details of the mount 200 are provided in the above-referenced U.S. patents.

Figure 8C:
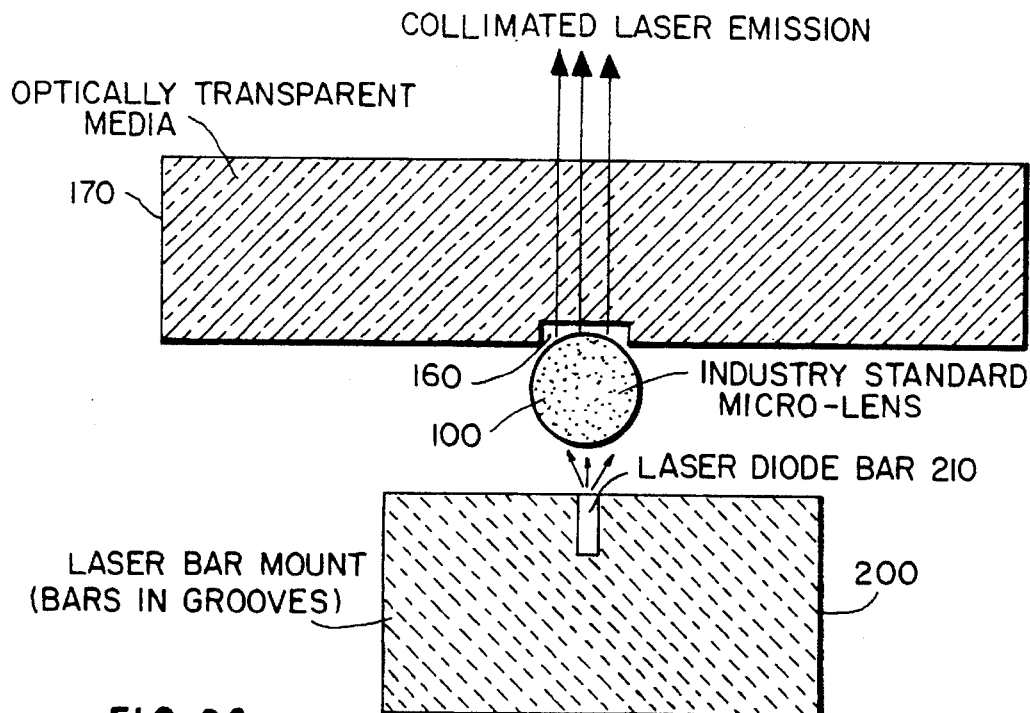
Figure 8D:
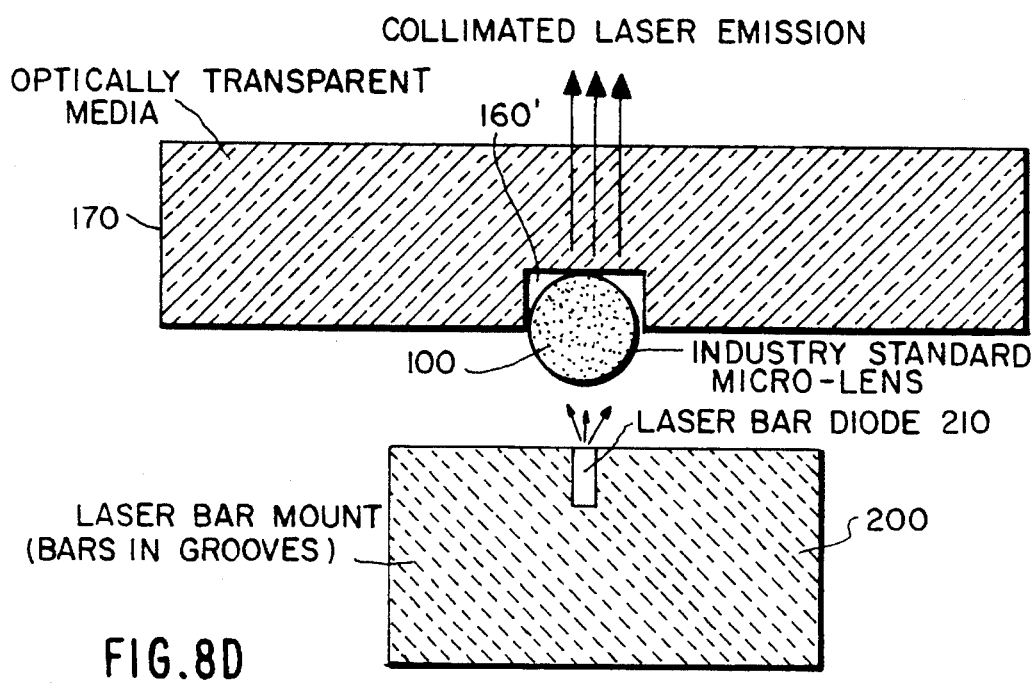
Figure 8E:
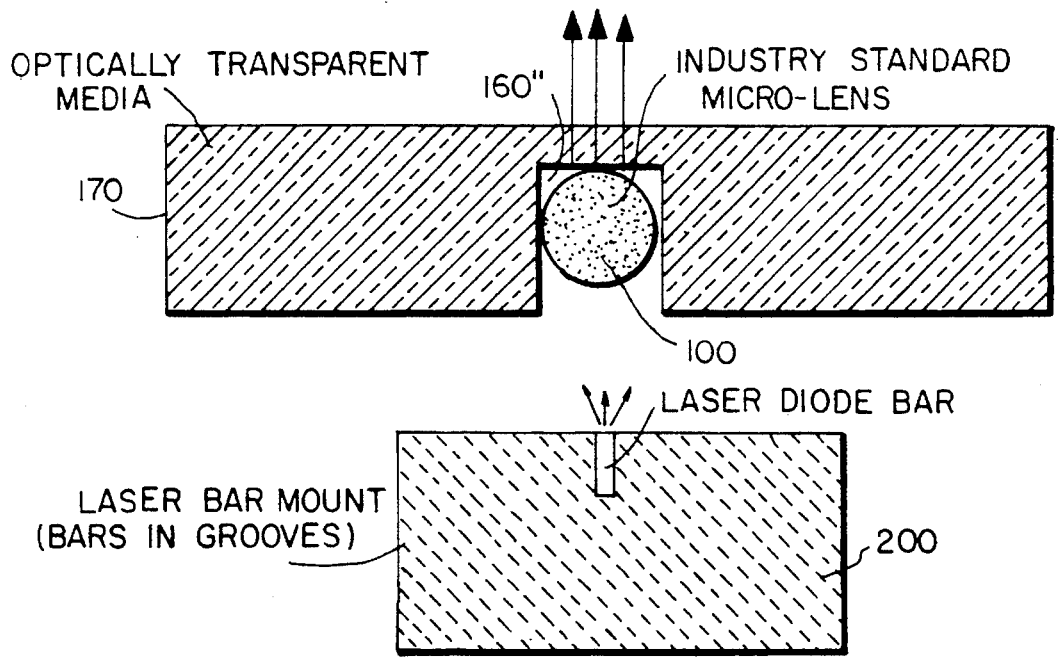

While FIG. 8A shows the groove 110 formed to be relatively shallow, so that the lens 100 protrudes from the groove, in FIG. 8B the lens 100 fits entirely within the groove 110'. FIGS. 8C–8E show a differently-shaped lens 150 formed in respective grooves 160, 160', and 160" which are of varying depths. Again, the grooves are formed precisely in optically transparent bases 170 so as to confront the laser diode bars 210 within mount 200.

Figure 9A:
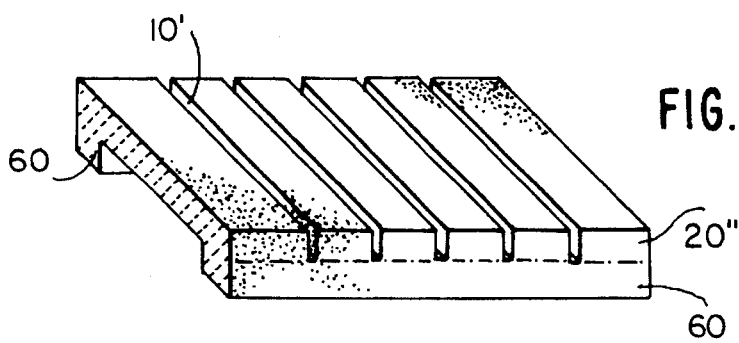
FIG. 9A and 9B are drawings of a lens support structure in accordance with yet another embodiment of the invention.
Figure 9B:
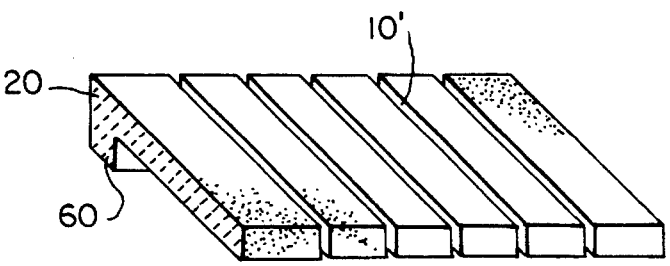

In FIGS. 3–7, the grooves 10 are shown as extending partially through the substrates 20, 20', and 50. In FIGS. 8A–8E, the grooves 110, 110', 160, 160' and 160" also are shown as extending partially through the respective substrates. However, the grooves also may be formed as slots which extend completely through the substrate, as shown in FIGS. 9A and 9B. Naturally, where the substrate is opaque, the grooves (slots) will of necessity extend completely through the substrate. In FIG. 9A, a substrate 20" has slots 10'. The substrate material is machined so that at opposite ends of the substrate 20", support rails 60 are provided on the underside of the substrate 20". The support rails 60 are shown as a separate element for the sake of clarity; however, in accordance with a preferred embodiment, the rails 60 will be made of the same material as the substrate 20", and in fact will be machined out of the same piece of material as the substrate 20" so that the overall lens support structure is unitary.

The support rails 60 perform two functions. One function is to hold the lenses in the slots 10'. The other is to provide a unitary structure; obviously, in the absence of the support rails, the structure would not be unitary.

FIG. 9A shows the support rails at opposite ends of the substrate 20". FIG. 9B is a cross-section taken through the substrate 20", past the point where one of the support rails 60 would be provided, so that it can be seen that the slots 10' extend all the way through the substrate 20".

Figure 10:
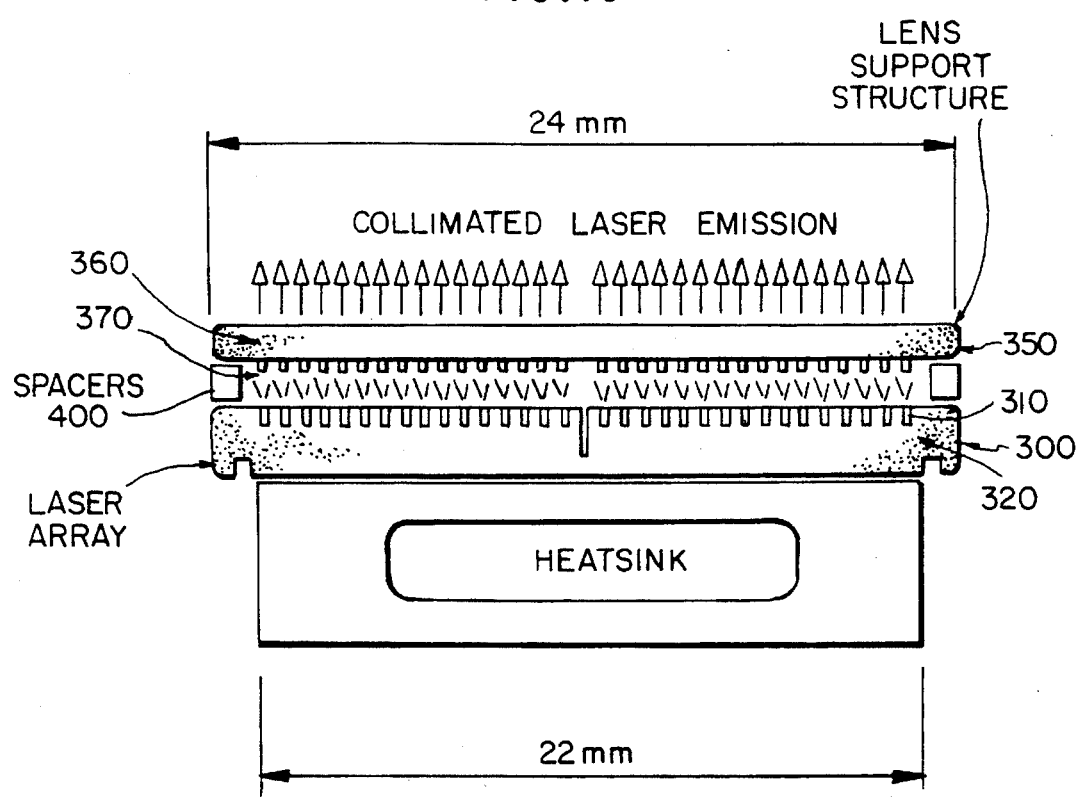
FIG. 10 shows one embodiment of an overall assembly of a laser diode array/optical element structure in accordance with the invention.

Finally, FIG. 10 shows an overall structure in which a laser array mount 300 containing a plurality of grooves 310, each containing one or more laser diode bars 320, is disposed in confronting relation to a base 350 containing further grooves 360, provided in precise relation to the grooves 310, and containing a plurality of microlenses 370. Spacers 400 are provided between the mount 300 and base 350. As can be seen from the Figure, laser light emitted from the laser diode bars 320 is collimated by respective microlenses 370, and exits through a surface of base 350 opposite that in which grooves 360 are formed. Again, details concerning the mount 300 may be found in the above-mentioned U.S. patents.

While the invention has been described in detail with reference to preferred embodiments, various changes and modifications within the scope and spirit of the invention will be apparent to those of working skill in this technological field. Thus, the invention is to be considered as limited only by the scope of the appended claims.

What is claimed is:

1. A lens support structure for use with a laser diode array having a plurality of laser diodes disposed in said array at a predetermined pitch with respect to each other, said lens support structure comprising:

an optically transmissive base having first and second major surfaces, a plurality of grooves being formed in one of said first major surface or said second major surface at said predetermined pitch; and a plurality of optical elements disposed in said grooves so as to allow optical radiation to pass through the optical elements;

wherein said base is adjustable relative to said laser diode array so as to align said optical elements with said laser diodes.

2. A lens support structure as claimed in claim 1, wherein said base comprises an active optical element which exerts an optical effect on said optical radiation.

3. A lens support structure as claimed in claim 1, wherein said base comprises a passive optical element which passes said optical radiation without exerting an effect thereon.

4. A lens support structure as claimed in claim 3, wherein said passive optical element comprises a glass plate.

5. A lens support structure as claimed in claim 1, wherein said optical elements comprise microlenses.

6. A lens support structure as claimed in claim 1, wherein said optical elements comprise collimating optical elements.

7. A lens support structure as claimed in claim 1, wherein said base is adjustable with respect to said laser diode array in at least one dimension.

8. A lens support structure as claimed in claim 1, wherein said plurality of grooves are a first plurality of grooves formed in said base along a first axis and said plurality of optical elements are a first plurality of optical elements, a second plurality of grooves being formed in said base along a second axis, orthogonal to said first axis, said structure further comprising a further plurality of optical elements disposed in said second plurality of grooves to provide collimation of light emitted by said laser diodes in addition to collimation provided by said first plurality of optical elements.

9. A laser diode device comprising:

a laser diode array comprising a plurality of laser diodes disposed at a predetermined pitch with respect to each other;

said laser diode device further comprising: a lens support structure comprising:

an optically transmissive base having first and second major surfaces, a plurality of grooves being formed at said predetermined pitch in one of said first major surface or said second major surface; and a plurality of optical elements disposed in said grooves so as to allow optical radiation to pass through the optical elements;

said laser diode device further comprising means for adjusting said laser diode array and said base with respect to each other so as to align said optical elements with said laser diodes.

10. A laser diode device as claimed in claim 9, wherein said base comprises an active optical element which exerts an optical effect on said optical radiation.

11. A laser diode device as claimed in claim 9, wherein said base comprises a passive optical element which passes said optical radiation without exerting an effect thereon.

12. A laser diode device as claimed in claim 11, wherein said passive optical element comprises a glass plate.

13. A lens support structure as claimed in claim 9, wherein said optical elements comprise microlenses.

14. A lens support structure as claimed in claim 9, wherein said optical elements comprise collimating optical elements.

15. A laser diode device as claimed in claim 9, wherein said means for positioning comprises at least one spacer provided between said substrate and said base.

16. A laser diode device as claimed in claim 9, wherein said base is adjustable with respect to said laser diode array in at least one dimension.

17. A lens support structure as claimed in claim 9, wherein said said plurality of grooves are a first plurality of grooves formed in said base along a first axis and said plurality of optical elements are a first plurality of optical elements, a second plurality of grooves being formed in said base along a second axis, orthogonal to said first axis, said structure further comprising a further plurality of optical elements disposed in said second plurality of grooves to provide collimation of light emitted by said laser diodes in addition to collimation provided by said first plurality of optical elements.

18. A lens support structure for use with a laser diode array having a plurality of laser diodes disposed in said array at a predetermined pitch with respect to each other, said lens support structure comprising:

a base having first and second major surfaces, a plurality of slots being formed in said first surface so as to extend from said first major surface through said second major surface at said predetermined pitch; and a plurality of optical elements disposed in said slots so as to allow optical radiation to pass through said optical elements;

wherein said base is adjustable relative to said laser diode array so as to align said optical elements with said laser diodes.

19. A lens support structure as claimed in claim 18, wherein alignment of said optical elements with said laser diodes assists in collimation of light emitted by said laser diode array.

20. A lens support structure as claimed in claim 19, wherein said plurality of slots are a first plurality of slots formed in said base along a first axis and said plurality of optical elements are a first plurality of optical elements, a second plurality of slots being formed in said base along a second axis, orthogonal to said first axis, said structure further comprising a further plurality of optical elements disposed in said second plurality of slots to provide collimation of light emitted by said laser diode array in addition to collimation provided by said first plurality of optical elements.

21. A lens support structure as claimed in claim 19, wherein said alignment minimizes divergence of said light emitted by said laser diode array.

22. A lens support structure as claimed in claim 18, wherein said base is adjustable in at least one dimension with respect to said laser diode array.

23. A lens support structure as claimed in claim 18, wherein said optical elements comprise microlenses.

24. A lens support structure as claimed in claim 18, wherein said optical elements comprise collimating optical elements.

25. A lens support structure as claimed in claim 18, further comprising a first support rail disposed at a nonzero angle with respect to said plurality of slots.

26. A lens support structure as claimed in claim 25, wherein said first support rail is formed unitarily with said base.

27. A lens support structure as claimed in claim 26, further comprising a second support rail, said first and second support rails being disposed at opposite ends of said base, orthogonally to said plurality of slots.

28. A laser diode device comprising:

a laser diode array comprising a plurality of laser diodes disposed at a predetermined pitch with respect to each other; and a lens support structure comprising:

a base having first and second major surfaces, a plurality of slots being formed in said first major surface so as to extend from said first major surface through said second major surface at said predetermined pitch; and a plurality of optical elements disposed in said slots so as to allow optical radiation to pass through said optical elements;

said laser diode device further comprising means for adjusting said laser diode array and said base with respect to each other so as to align said optical elements with said laser diodes.

29. A laser diode device as claimed in claim 28, wherein alignment of said optical elements with said laser diodes assists in collimation of light emitted by said laser diode array.

30. A laser diode device as claimed in claim 29, wherein said plurality of slots are a first plurality of slots formed in said base along a first axis and said plurality of optical elements are a first plurality of optical elements, a second plurality of slots being formed in said base along a second axis, orthogonal to said first axis, said structure further comprising a further plurality of optical elements disposed in said second plurality of slots to provide collimation of light emitted by said laser diode array in addition to collimation provided by said first plurality of optical elements.

31. A laser diode device as claimed in claim 29, wherein said alignment minimizes divergence of said light emitted by said laser diode array.

32. A laser diode device as claimed in claim 28, wherein said base is adjustable in at least one dimension with respect to said laser diode array.

33. A laser diode device as claimed in claim 28, wherein said optical elements comprise microlenses.

34. A laser diode device as claimed in claim 28, wherein said optical elements comprise collimating optical elements.

35. A laser diode device as claimed in claim 28, further comprising a first support rail disposed at a nonzero angle with respect to said plurality of slots.

36. A laser diode device as claimed in claim 35, wherein said first support rail is formed unitarily with said base.

37. A laser diode device as claimed in claim 36, further comprising a second support rail, said first and second support rails being disposed at opposite ends of said base, orthogonally to said plurality of slots.

\* \* \* \* \*